United States Patent
Ok et al.

(10) Patent No.: US 10,629,721 B2
(45) Date of Patent: Apr. 21, 2020

(54) CONTACT RESISTANCE REDUCTION FOR ADVANCED TECHNOLOGY NODES

(71) Applicant: International Business Machines Corporation, Armonk, NY (US)

(72) Inventors: Injo Ok, Loudonville, NY (US); Balasubramanian Pranatharthiharan, Watervliet, NY (US); Charan V. V. S. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/247,011

(22) Filed: Jan. 14, 2019

(65) Prior Publication Data

US 2019/0148535 A1    May 16, 2019

Related U.S. Application Data

(62) Division of application No. 14/956,718, filed on Dec. 2, 2015, now abandoned.

(51) Int. Cl.
*H01L 21/70* (2006.01)
*H01L 29/78* (2006.01)
(Continued)

(52) U.S. Cl.
CPC ........ *H01L 29/78* (2013.01); *H01L 21/76831* (2013.01); *H01L 21/76852* (2013.01);
(Continued)

(58) Field of Classification Search
CPC ............... H01L 29/064; H01L 29/0653; H01L 29/66477; H01L 21/7689; H01L 21/823475; H01L 21/823481; H01L 23/535; H01L 27/088; H01L 21/66545; H01L 21/76897; H01L 21/76831; H01L 21/76852; H01L 21/76865;
(Continued)

(56) References Cited

U.S. PATENT DOCUMENTS 5,780,339 A   7/1998  Liu
6,008,114 A  12/1999  Li
(Continued)

FOREIGN PATENT DOCUMENTS

KR   100548527 B1   1/2006
KR   101045089 B1   6/2011

OTHER PUBLICATIONS

List of IBM Patents or Patent Applications Treated as Related; (Appendix P), Filed Jan. 15, 2019, 2 pages.

*Primary Examiner* — Eric A. Ward
(74) *Attorney, Agent, or Firm* — Cantor Colburn LLP; Alvin Borromeo (57) ABSTRACT

A source/drain contact includes a first portion arranged on a substrate and extending between a first gate and a second gate; a second portion arranged on the first portion and extending over the first gate and the second gate, the second portion including a partially recessed liner and a metal disposed on the partially recessed liner, and the partially recessed liner arranged on an endwall of the second portion and in contact with the first portion; and an oxide disposed around the second portion and on the first gate and the second gate.

7 Claims, 13 Drawing Sheets

(51) Int. Cl.
   *H01L 21/8234* (2006.01)
   *H01L 29/06* (2006.01)
   *H01L 21/768* (2006.01)
   *H01L 23/485* (2006.01)
   *H01L 27/088* (2006.01)

(52) U.S. Cl.
   CPC .. *H01L 21/76865* (2013.01); *H01L 21/76885* (2013.01); *H01L 21/823475* (2013.01); *H01L 23/485* (2013.01); *H01L 29/0649* (2013.01); H01L 21/76897 (2013.01); H01L 27/088 (2013.01)

(58) Field of Classification Search
   CPC ......... H01L 21/76885; H01L 21/76895; H01L 23/485; H01L 23/5226; H01L 27/10855; H01L 29/0649; H01L 29/78
   See application file for complete search history.

(56) References Cited

U.S. PATENT DOCUMENTS

| | | | |
|---|---|---|---|
| 6,171,964 B1 | 1/2001 | Gonzalez et al. | |
| 6,218,296 B1 | 4/2001 | Kwak et al. | |
| 6,495,427 B2 | 12/2002 | Fazan et al. | |
| 6,566,241 B2* | 5/2003 | Chun | H01L 21/76831 438/618 |
| 6,768,154 B2 | 7/2004 | Miyajima | |
| 6,946,701 B2 | 9/2005 | Niuya | |
| 7,875,550 B2 | 1/2011 | Costrini et al. | |
| 8,026,167 B2 | 9/2011 | Ryu et al. | |
| 8,044,467 B2 | 10/2011 | Lee | |
| 8,053,360 B2* | 11/2011 | Yamazaki | H01L 21/76831 257/E21.584 |
| 9,147,767 B2 | 9/2015 | Chen et al. | |
| 9,209,072 B2* | 12/2015 | Lee | H01L 21/76843 |
| 2001/0033029 A1* | 10/2001 | Lee | H01L 21/7684 257/774 |
| 2004/0077143 A1 | 4/2004 | Lee et al. | |
| 2006/0264047 A1 | 11/2006 | Kim | |
| 2007/0123040 A1 | 5/2007 | Hwang | |
| 2008/0121622 A1 | 5/2008 | Hwang et al. | |
| 2011/0156107 A1* | 6/2011 | Bohr | H01L 21/76831 257/288 |
| 2017/0162444 A1 | 6/2017 | Ok | |

* cited by examiner

CONTACT RESISTANCE REDUCTION FOR ADVANCED TECHNOLOGY NODES

DOMESTIC PRIORITY

This application is a divisional of U.S. application Ser. No. 14/956,718, filed Dec. 2, 2015, the contents of which are incorporated by reference herein in its entirety.

BACKGROUND

The present invention relates to complementary metal oxide semiconductor (CMOS), and more specifically, to methods and structures for reducing contact resistance.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

SUMMARY

According to an embodiment, a method of making a source/drain contact includes forming a first trench in an inter-layer dielectric (ILD) arranged on a substrate, the first trench extending between a first gate and a second gate; filling the first trench with a metal to form a first portion of the source/drain contact; depositing an oxide on the first portion of the source/drain contact, the first gate, and the second gate; forming a second trench in the oxide to form a second portion of the source/drain contact; depositing a liner on an endwall of the second trench and on a sidewall of the second trench, the liner contacting the first portion of the source/drain contact; depositing a metal on the liner to fill the trench; recessing the liner by a partial etch process such that a portion of the liner remains arranged on the endwall of the trench between the metal and the first portion, the partial etch process forming a recess between the oxide and the metal; and depositing an oxide liner in the recess to form an oxide spacer between the oxide and the liner.

According to another embodiment, a method of making a source/drain contact includes forming a first trench in an inter-layer dielectric (ILD) arranged on a substrate, the first trench extending between a first gate and a second gate; filling the first trench with a metal to form a first portion of the source/drain contact; depositing a first oxide on the first portion of the source/drain contact, the first gate, and the second gate; forming a second trench in the oxide to form a second portion of the source/drain contact; depositing a liner on an endwall of the second trench and on a sidewall of the second trench, the liner contacting the first portion of the source/drain contact; depositing a metal on the liner to fill the second trench; recessing the liner by a partial etch process such that a portion of the liner remains arranged on the endwall of the trench between the metal and the first portion, the partial etch process forming a recess between the oxide and the metal; recessing the first oxide by a partial etch process such that a portion of the first oxide remains arranged on the first gate and the second gate; and depositing a second oxide on the first oxide to form a bilayer oxide over the first gate and the second gate.

Yet, according to another embodiment, a source/drain contact includes a first portion arranged on a substrate and extending between a first gate and a second gate; a second portion arranged on the first portion and extending over the first gate and the second gate, the second portion including a partially recessed liner and a metal disposed on the partially recessed liner, and the partially recessed liner arranged on an endwall of the second portion and in contact with the first portion; and an oxide disposed around the second portion and on the first gate and the second gate.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1A-1D illustrate exemplary methods of making source/drain contacts in semiconductor devices according to a first embodiment, in which:

FIGS. 2A-2D illustrate exemplary methods of making source/drain contacts in semiconductor devices according to a second embodiment, in which:

FIGS. 3A-3E illustrate exemplary methods of making a source/drain contact in semiconductor devices according to a third embodiment, in which:

DETAILED DESCRIPTION

When a MOSFET is scaled down through various technology nodes, several techniques are employed to improve device performance. One technique for 7 nanometer (nm) devices is to employ a source/drain contact with two portions. A first portion is arranged in contact with the source/drain and extends to the top of the gates (also called a TS). A second portion is arranged on the first portion and extends over the gates (also called a CA). The endwall of the second portion is limited to the width of the the endwall of the first portion adjacent to the gates. When the contacts include tungsten, a titanium nitride (TiN) layer may be deposited along sidewalls of the first portion and second portion of the contact to function as a wetting layer for the tungsten.

Reducing contact resistance of source/drain contacts is challenging. One method for minimizing resistance is to increase the size of the second portion of the source/drain contact (the CA). However, increasing dimensions of the second portion of the source/drain contact may lead to electrical shorting between second portions of adjacent source/drain contacts when the dimensions are too large because overlap between the two structures may occur. Misalignment between the second portion of the source/drain contact and the gate cap may also occur, which can result in loss of the material forming the gate cap (e.g., silicon nitride) and high resistance and electrical shorting.

Accordingly, various embodiments provide methods of making semiconductor devices with wide source/drain contacts that minimize contact resistance. In some embodiments, the liner layer along sidewalls of the second portion of the source/drain contact is partially removed after depositing the conductive metal, which reduces resistance. The disclosed methods avoid electrical shorting between adjacent contacts. In one embodiment, a bilayer oxide is disposed around the second portion of the source/drain contact. In another embodiment, a low-resistance metal spacer is formed around the second portion of the source/drain contact. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Figure 1A:
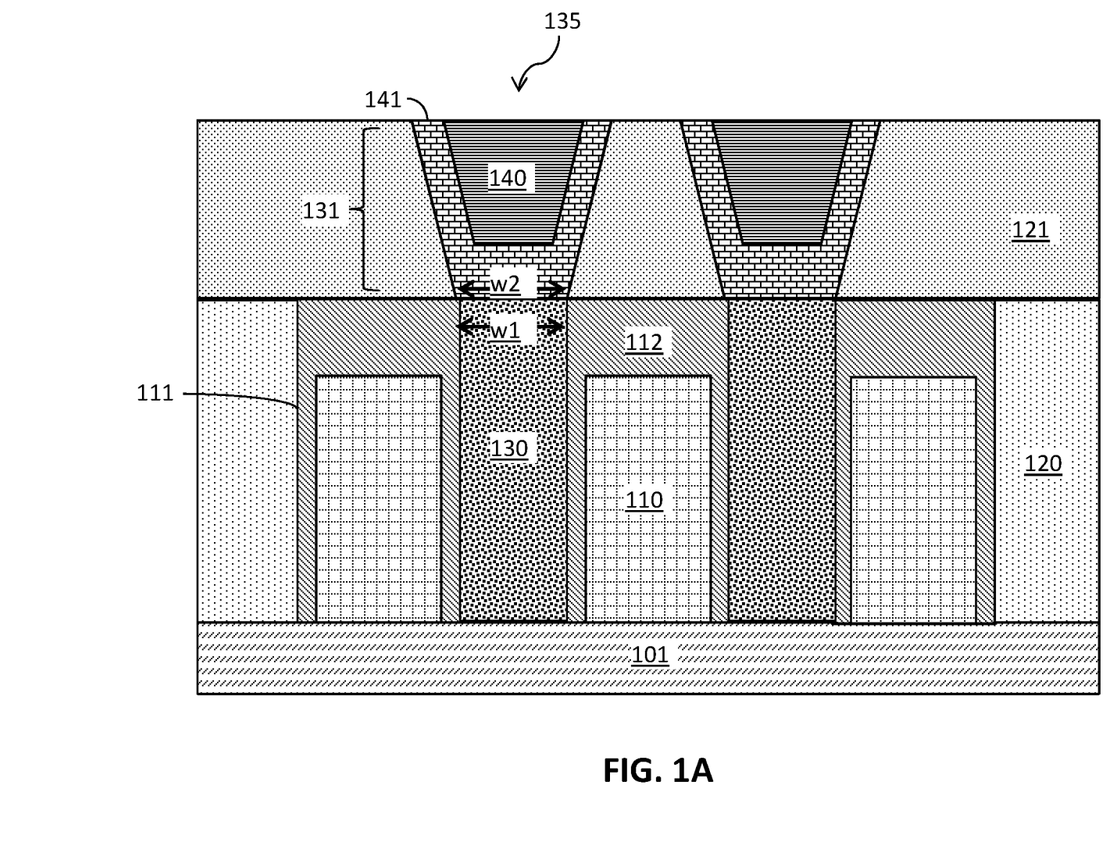
FIG. 1A is a cross-sectional side view of source/drain contacts having first and second portions arranged between and over gates, respectively.

Turning now to the Figures, FIGS. 1A-1D illustrate exemplary methods of making source/drain contacts in semiconductor devices according to a first embodiment. FIG. 1A is a cross-sectional side view of source/drain contacts 135 arranged between gates 110 disposed on a substrate 101.

The substrate 101 may include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CaSe (cadmium selenide), CaS (cadmium sulfide), CaTe (cadmium telluride), ZnO (zinc oxide), ZnSe (zinc selenide), ZnS (zinc sulfide), or ZnTe (zinc telluride)), or any combination thereof. Other examples of suitable substrates 101 include silicon-on-insulator (SOI) substrates and silicon-germanium on insulator substrates with buried dielectric layers.

The gates 110 may be formed either by a replacement metal gate process, i.e., replacing a dummy gate (including a sacrificial gate material), or by gate-first process, i.e., directly forming the gates 110 on the substrate 101. The gates 110 may include a gate stack that includes one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

A gate spacer 111 is arranged along sidewalls of the gates 110. The gate spacer 111 may include an insulating material, for example, silicon dioxide, silicon nitride, SiOCN, or SiBCN. Other non-limiting examples of materials for the gate spacers 111 include dielectric oxides (e.g., silicon oxide), dielectric nitrides (e.g., silicon nitride), dielectric oxynitrides, or any combination thereof. The gate spacer 111 material may deposited by a deposition process, for example, chemical vapor deposition (CVD) or physical vapor deposition (PVD). After deposition, an anisotropic dry etch process, for example, reactive ion etch (RIE), is performed to etch the insulating material and form gate spacers 111.

A gate cap 112 is arranged on a surface of the gates 110. An insulating hard mask layer, for example, silicon nitride (SiN), SiOCN, or SiBCN is deposited on the gate 110 to form a hard mask cap. The gate cap 112 material may be deposited using a deposition process, including, but not limited to, PVD, CVD, PECVD, or any combination thereof. The gate cap material is then patterned and etched to form the gate caps 112.

An interlayer dielectric (ILD) 120 is deposited around the gates 110. The ILD 120 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 120 may be deposited by a deposition process, including, but not limited to CVD, PVD, plasma enhanced CVD, atomic layer deposition (ALD), evaporation, chemical solution deposition, or like processes.

A source/drain (active area) (not shown) may be formed on the substrate 101 between the gates 110. The source/drain may include an epitaxially grown layer. The epitaxial layers may be grown using a growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. Alternatively, the source/drain can be formed by incorporating dopants into the substrate 101.

The source/drain contact 135 includes a first portion 130 and a second portion 131. The first portion 130 is arranged between the gates 110 and extends from the substrate 101 (or source/drain) to the top of the gate caps 112.

The first portion 130 of the source/drain contact 135 is formed by removing the ILD 120 between the gates 110 to form a trench that extends from the source/drain to the top of the gate caps 112. To remove the ILD 120 and form the trenches, a resist, such as a photoresist, may be deposited and patterned. An etch process, such as a reactive ion etch (RIE), may be performed using the patterned resist as an etch mask to remove the ILD 120 until the source/drain or substrate 101 is exposed.

The contact trenches are filled with a conductive material or a combination of conductive materials. In one embodiment, the contact trenches are filled with a conductive liner (e.g., titanium nitride) followed by tungsten. In another embodiment, the contact trenches are filled with a metal silicide film and a conductive material up to the level of at least the gate 110, or in some embodiments, the level of the gate cap 212.

The liner material of the first portion 130 depends on the type of transistor and may include one or more materials that provide low contact resistance. Non-limiting examples of materials for the liner include Co, Ti, CoTi, Ni, Pt, NiPt, NiPtTi, Ta, TaNi, TaAl, TaAlN, TiN, TiAl, TiAlN, or any combination thereof. The one or more layers/films making up the liner may be formed by a chemical vapor deposition process (CVD), atomic layer deposition (ALD), or other suitable process.

The conductive material filling the first portion 130 may be a conductive metal, for example, aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, or sputtering.

The second portion 131 of the source/drain contact 135 contacts the first portion 130 and includes a liner 141 and a metal 140 disposed on the liner 141. To form the second portion of the source/drain contact 135, an oxide 121 (middle-of-line oxide) is deposited on the gates 110 and ILD 120. The oxide 121 may be, for example, silicon dioxide, tetraethylorthosilicate (TEOS) oxide, high aspect ratio plasma (HARP) oxide, high temperature oxide (HTO), high density plasma (HDP) oxide, a flowable oxide, a high density plasma oxide, borophosphosilicate glass (BPSG), or any combination thereof.

A trench is formed in the oxide 121 by removing the oxide 121 over the first portion 130. A resist, such as a photoresist, may be deposited and patterned. An etch process, such as a reactive ion etch (RIE), may be performed using the patterned resist as an etch mask to remove the oxide 121 until the source/drain first portion 130 is exposed.

The liner 141 is deposited along sidewalls of the trench in the oxide 121 and on the endwall in contact with the first portion 130. In an exemplary embodiment, the liner 141 includes titanium nitride (TiN). Other non-limiting examples of materials for the liner 141 include Co, Ti, CoTi, Ni, Pt, NiPt, NiPtTi, Ta, TaNi, TaAl, TaAlN, TiAl, TiAlN, or any combination thereof. The one or more layers/films making up the liner 141 may be formed by a chemical vapor deposition process (CVD), atomic layer deposition (ALD), or other suitable process.

A metal 140 is disposed on the liner 141 to fill the trench within the oxide 121 and form the second portion 131 of the source/drain contact 135. The metal 140 may be, for example, aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, or sputtering. A planarization process, for example, chemical mechanical planarization (CMP) is performed to remove any metal 140 from the surface of the oxide 121.

The second portion 131 of the source/drain contact 135 including the liner 141 and metal 140 has a width that may be as wide as the first portion 130. The second portion may have different widths and taper in width as shown in FIG. 1A. In some embodiments, the second portion has a width w2 of about 7 to about 30 nm. In other embodiments, the second portion has a width w2 in a range from about 10 to about 20 nm. By comparison, the first portion 130 has a width of about 7 to about 30 nm in some embodiments, or about 10 to about 20 in other embodiments.

Figure 1B:
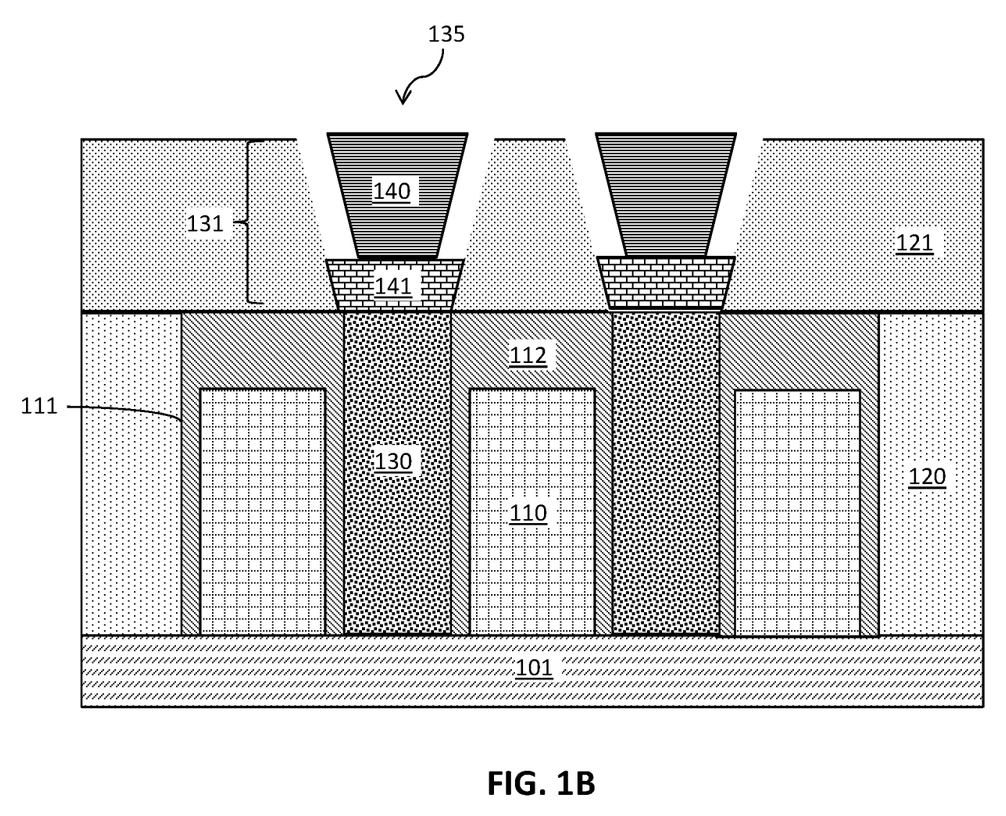
FIG. 1B is a cross-sectional side view after partially recessing the liner arranged along sidewalls of the second portion of the source/drain contact.

FIG. 1B is a cross-sectional side view after partially recessing the liner 141 along sidewalls of the second portion of the source/drain contact to form recesses. The liner 141 is recessed down to about the level of the metal 140 such that a portion of the liner 141 remains between the metal 140 and the first portion 130.

A portion of the liner 141 is removed between the metal 140 and the oxide 121 by a dry etch and/or a wet etch process. The etch process should leave the metal 140 and the oxide 121 substantially intact. The dry etch process may be, for example, a SF$_6$/Ar process. The wet etch process may be, for example, a SC-1 solution.

Figure 1C:
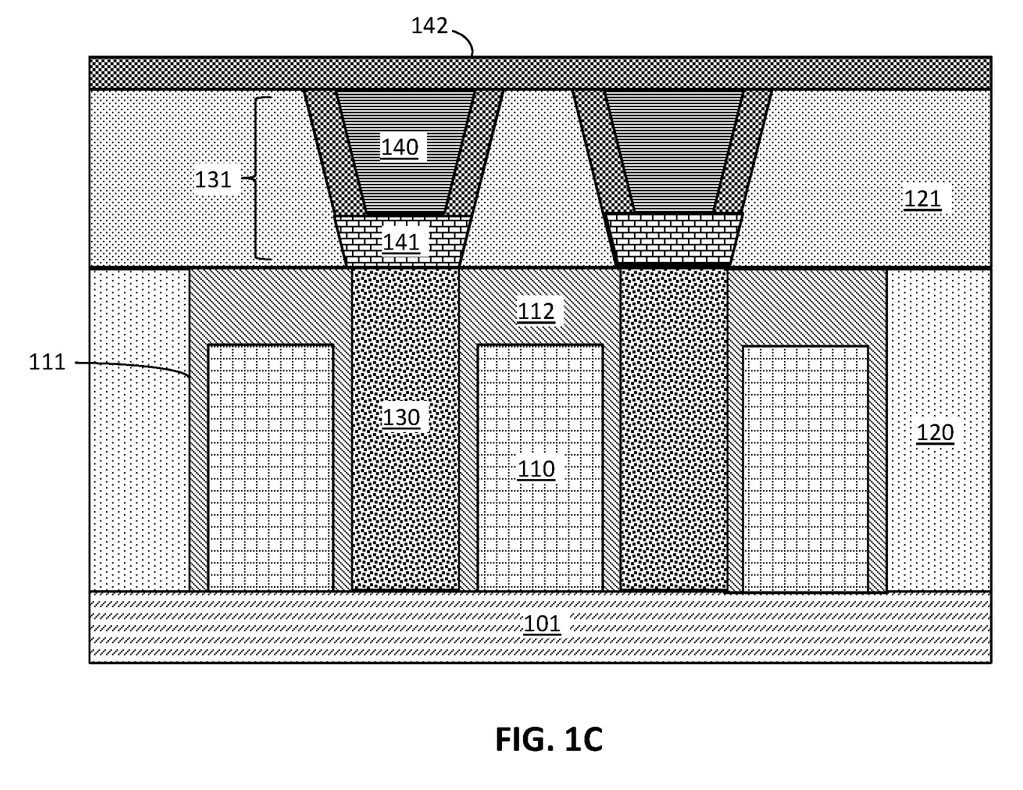
FIG. 1C is a cross-sectional side view after depositing an oxide within the recesses.

FIG. 1C is a cross-sectional side view after depositing an oxide 142 along sidewalls of the second portion of the source/drain contact and on the oxide 121. The oxide 142 is deposited within the recesses formed after removing the liner 141 and is arranged between the metal 140 and the oxide 121. When a portion of the liner 141 remains between the first portion 130 and the metal 140, the oxide 142 is also disposed on the liner 141.

Non-limiting examples of oxides 142 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide 142 may be a different material than the oxide 121.

The oxide 142 forms an oxide liner/spacer along sidewalls of the second portion 131 of the source/drain contact 135. The oxide liner is disposed on a sidewall of the metal 140 and on the partially recessed liner 141. The oxide 142 is disposed between the oxide 121 and the metal 140.

The oxide 142 forming the liner may have a thickness in a range from about 5 nm to about 50 nm in some embodiments. Yet, in other embodiments, the oxide 142 has a thickness in a range from about 10 to about 30 nm.

Figure 1D:
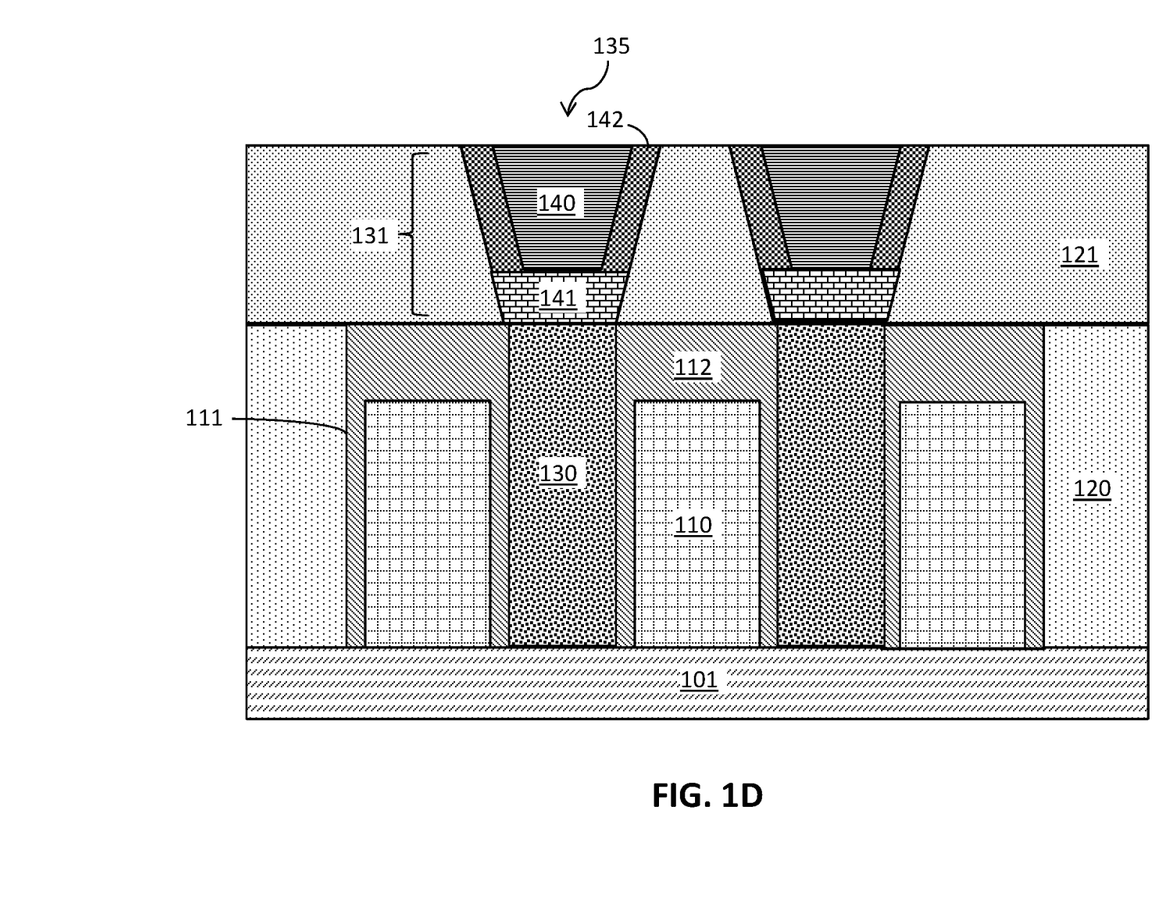
FIG. 1D is a cross-sectional side view after performing a planarization process.

FIG. 1D is a cross-sectional side view after performing a planarization process to remove excess oxide 142 remaining on the oxide 121. The planarization process may be an RIE process that stops on the metal 140.

Figure 2A:
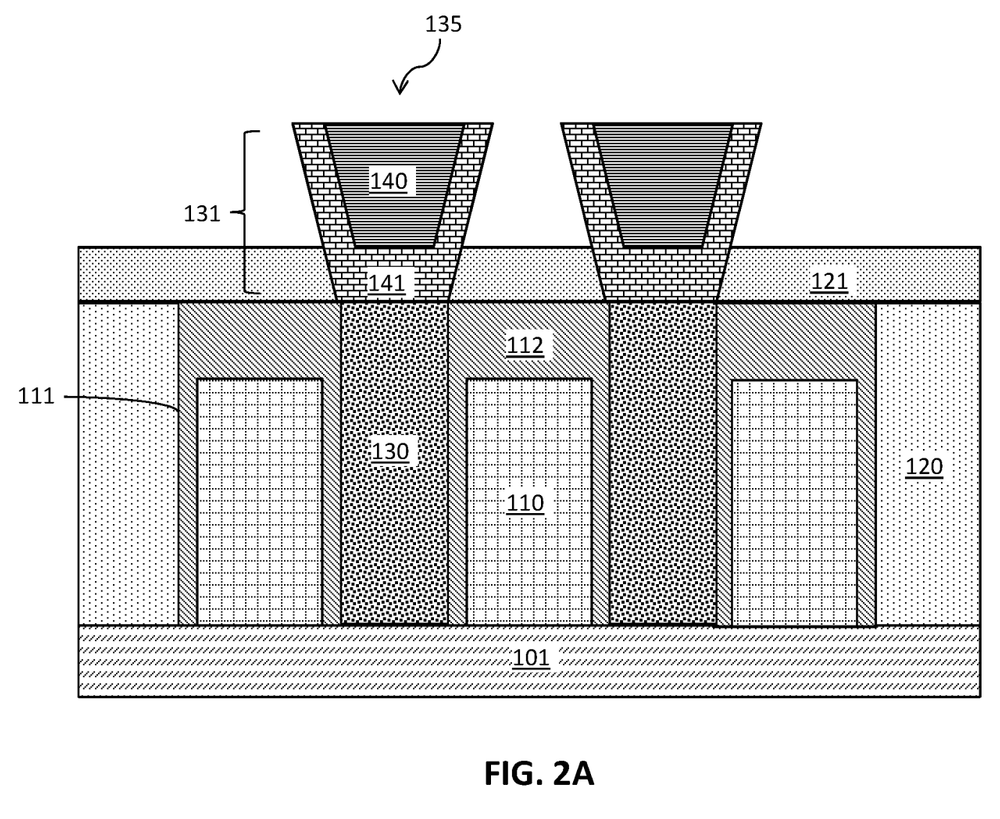
FIG. 2A is a cross-sectional side view after partially recessing the oxide around the second portion of the source/drain contact.

FIGS. 2A-2D illustrate exemplary methods of making source/drain contacts in semiconductor devices according to a second embodiment. FIG. 2A is a cross-sectional side view after partially recessing the oxide 121 around the second portion of the source/drain contact 131. A portion of the oxide 121 remains on the gates 110. The oxide 121 is recessed to a thickness of about 5 to about 50 nm in some embodiments. In an exemplary embodiment, the oxide 121 is recessed from a thickness of about 70 to 100 nm to a thickness of about about 5 to 20 nm, or about 5 to about 50 nm.

The oxide 121 is recessed such that at least a portion of the oxide 121 remains on an endwall of the second portion 131 of the source/drain contact 135. The oxide 121 may be recessed by performing a wet etch, for example, a HF based solution. The wet etch is a partial etch that does not completely remove the oxide 121.

Figure 2B:
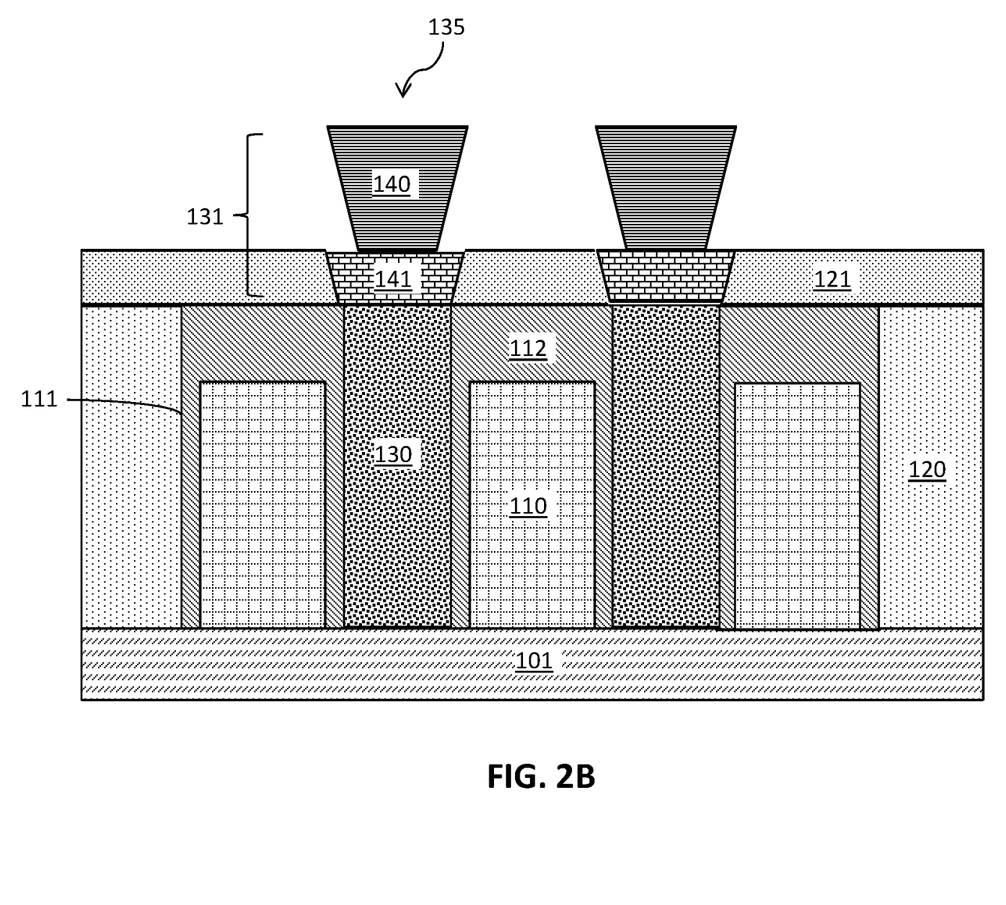
FIG. 2B is a cross-sectional side view after partially recessing the liner along sidewalls of the second portion of the source/drain contact.

FIG. 2B is a cross-sectional side view after partially recessing the liner 141 along sidewalls of the second portion 131 of the source/drain contact 135 to expose the metal 140. The liner 141 is recessed down to about the level of the metal 140 such that a portion of the liner 141 remains along an endwall of the second portion 131 between the metal 140 and the first portion 130.

A portion of the liner 141 is removed between the metal 140 and the oxide 121 by a dry etch and/or a wet etch process. The etch process should leave the metal 140 and the oxide 121 substantially intact. The dry etch process may be, for example, RIE.

Figure 2C:
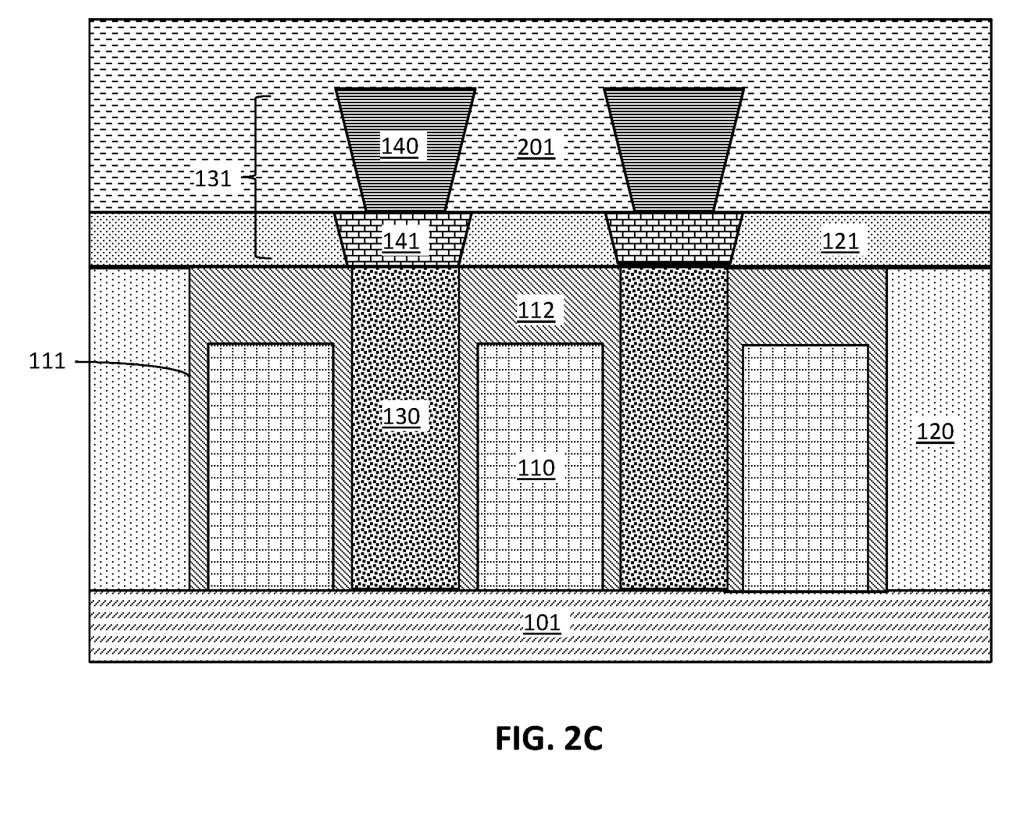
FIG. 2C is a cross-sectional side view after depositing an oxide around the second portion of the source/drain contact.

FIG. 2C is a cross-sectional side view after depositing an oxide 201 on the exposed metal 140 of the second portion 131 of the source/drain contact 135. The oxide 201 contacts the metal 140 and replaces the liner 141 along sidewalls of the metal 140.

The oxide 201 may be a low-k oxide having a k<4.0, including but not limited to, silicon oxide, spin-on-glass, a flowable oxide, a high density plasma oxide, borophosphosilicate glass (BPSG), or any combination thereof. The low-k oxide 201 may be deposited by a deposition process, including, but not limited to CVD, PVD, plasma enhanced CVD, atomic layer deposition (ALD), evaporation, chemical solution deposition, or like processes.

The oxide 201 (second oxide) may be different than the oxide 121 (first oxide) to form a bilayer oxide around the second portion 131 of the source/drain contact 135. The first oxide 201 is disposed adjacent to the partially recessed liner 141, and the second oxide 201 is disposed on the first oxide 121 and adjacent to the metal 140. The second oxide 201 directly contacts the metal 140 and replaces the liner 141 that was recessed.

Figure 2D:
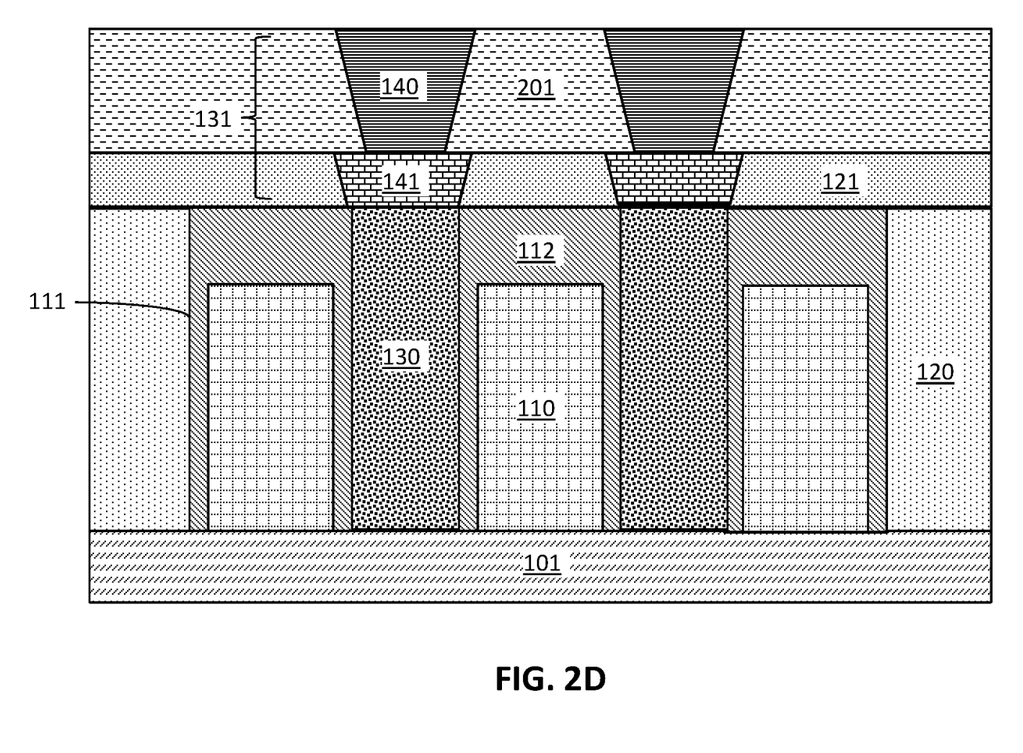
FIG. 2D is a cross-sectional side view after performing a planarization process.

FIG. 2D is a cross-sectional side view after performing a planarization process. The planarization process stops on the metal 140 and removes excess oxide 201 from the surface of the metal 140. The planarization process may be, for example, a CMP process.

Figure 3A:
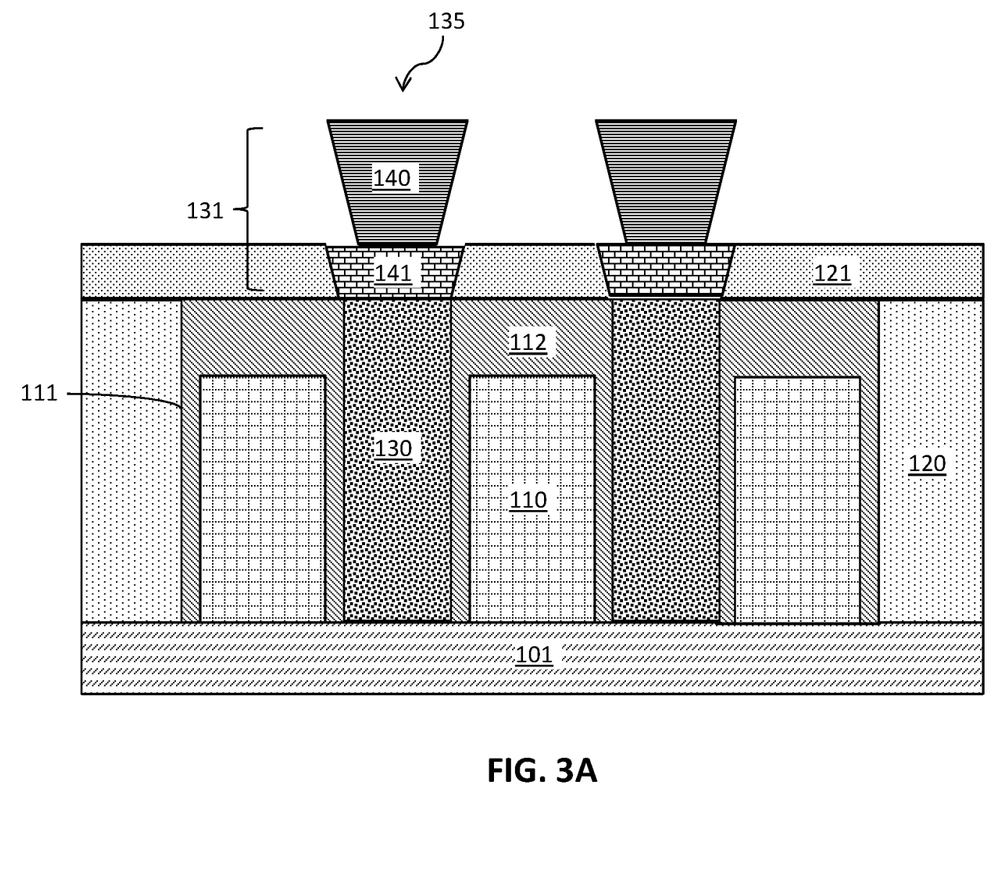
FIG. 3A is a cross-sectional side view after partially recessing the oxide and the liner around the second portion of the source/drain contact.

FIGS. 3A-3E illustrate exemplary methods of making source/drain contacts in semiconductor devices according to a third embodiment. FIG. 3A is a cross-sectional side view after partially recessing the oxide 121 and the liner 141 around the second portion of the source/drain contact. The oxide 121 may be recessed by methods and thicknesses described above in FIG. 2A. The etch process is a partial etch that does not completely remove the oxide 121.

Figure 3B:
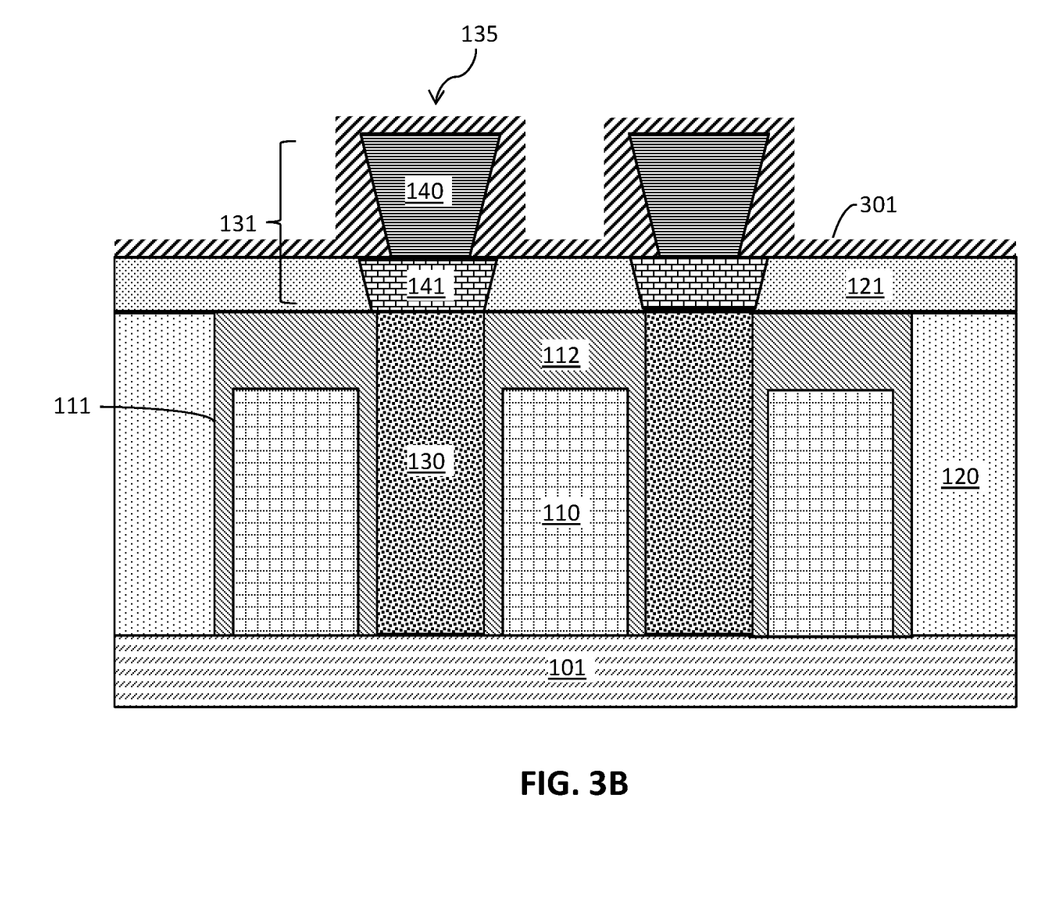
FIG. 3B is a cross-sectional side view after depositing a metal layer on the second portion of the source/drain contact.

FIG. 3B is a cross-sectional side view after depositing a metal layer 301 on the metal 140 of the second portion 131 of the source/drain contact 135. The metal layer 301 covers sidewalls and a surface of the metal 140. The metal layer 301 has a lower resistance than the material forming the liner 141. In one embodiment, the liner 141 includes TiN, and the metal layer 301 has a lower resistance than TiN.

The metal layer 301 may include, for example, cobalt, copper, nickel, platinum, tungsten, or any combination thereof. The metal layer 301 may be formed by any suitable deposition method. Non-limiting examples of deposition methods include chemical vapor deposition (CVD), physical vapor deposition (PVD), atomic layer deposition (ALD), or any combination thereof.

Figure 3C:
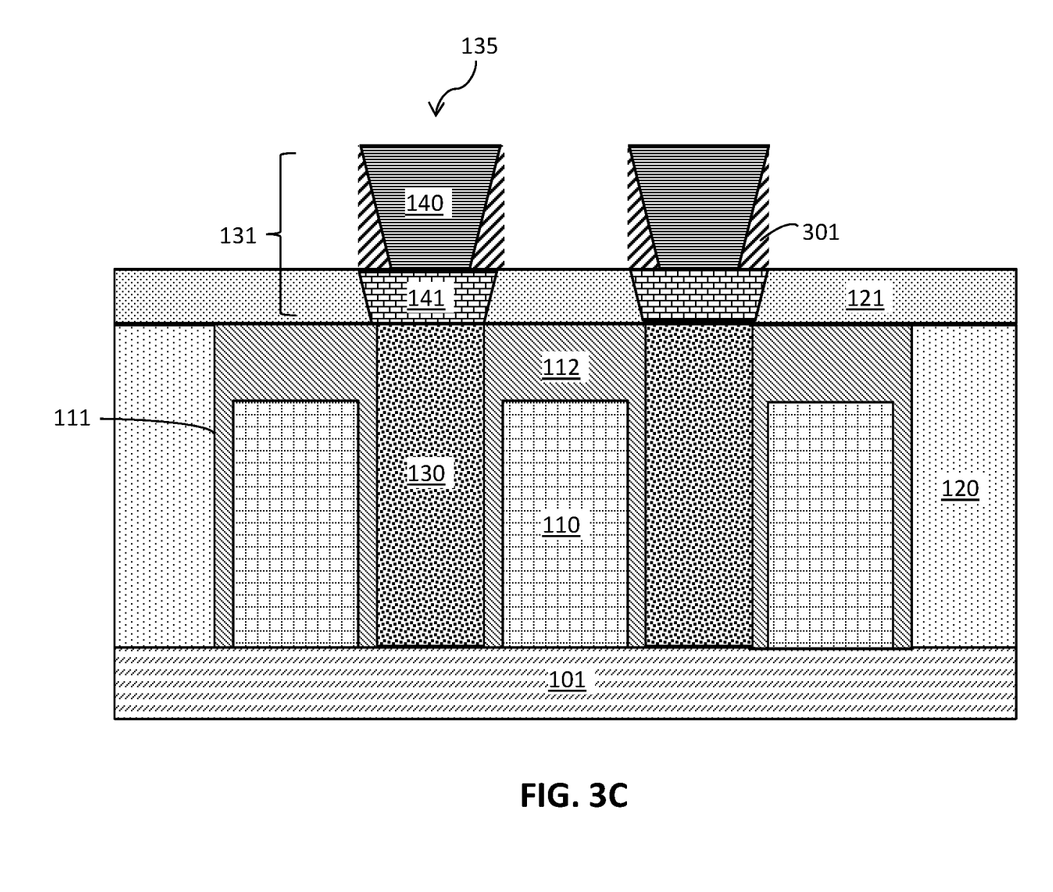
FIG. 3C is a cross-sectional side view after etching the metal layer to form metal spacers.

FIG. 3C is a cross-sectional side view after etching the metal layer 301 to form metal spacers along sidewalls of the second portion 131 of the source/drain contact 135. The metal spacers line sidewalls of the metal 140 and are disposed on the liner 141. The metal layer 301 may be etched using a dry etch process, for example, RIE.

Figure 3D:
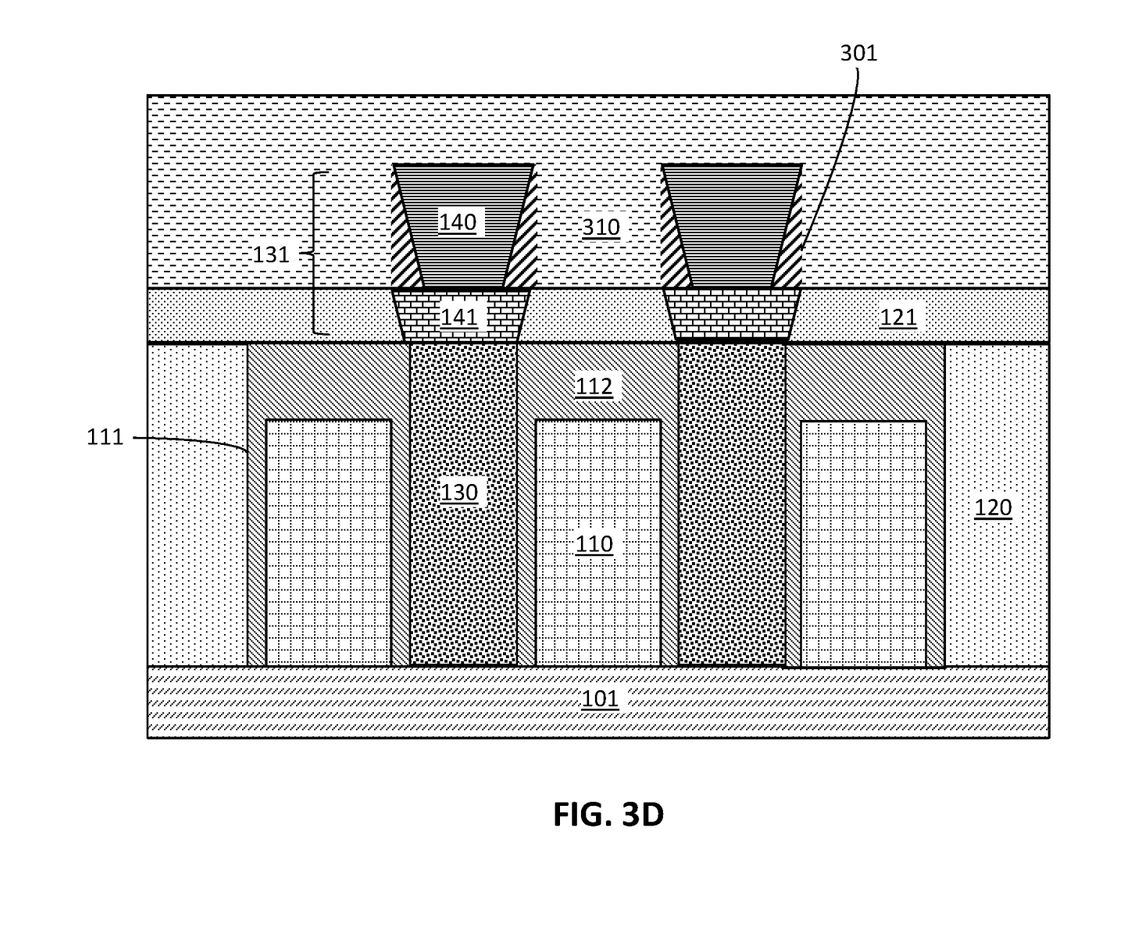
FIG. 3D is a cross-sectional side view after depositing an oxide on the second portion of the source/drain contact.

FIG. 3D is a cross-sectional side view after depositing an oxide 310 (second oxide) on the second portion 131 of the source/drain contact 135. The oxide 310 is disposed on a surface of the metal 140. The oxide 310 (second oxide) and the oxide 121 (first oxide) form a bilayer oxide as described in FIG. 2C. The metal spacers are arranged between the oxide 310 and the metal 140 of the second portion 131 of the source/drain contact 135.

The oxide 310 may be a low-k oxide having a k<4.0, including but not limited to, silicon oxide, spin-on-glass, a flowable oxide, a high density plasma oxide, borophosphosilicate glass (BPSG), or any combination thereof. The oxide 310 may be deposited by a deposition process, including, but not limited to CVD, PVD, plasma enhanced CVD, atomic layer deposition (ALD), evaporation, chemical solution deposition, or like processes.

Figure 3E:
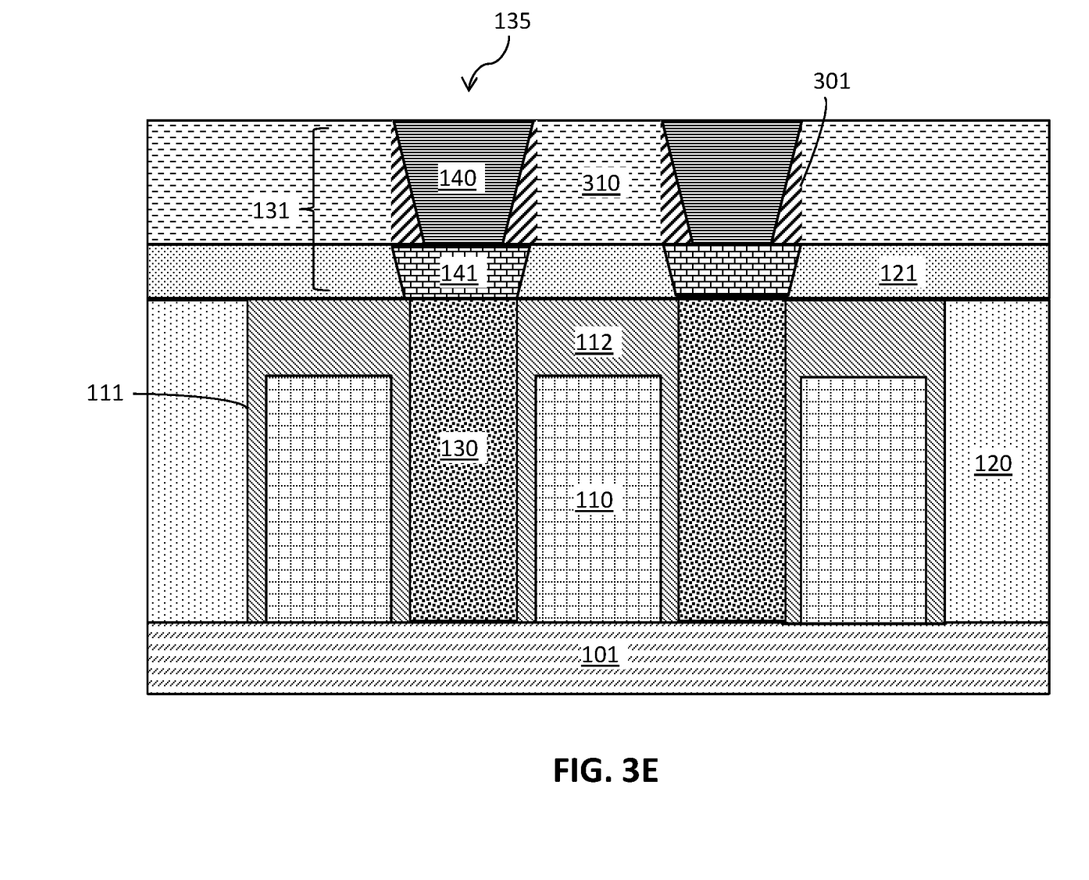
FIG. 3E is a cross-sectional side view after performing a planarization process.

FIG. 3E is a cross-sectional side view after performing a planarization process. The planarization process stops on the metal 140 and removes excess oxide 310 from the surface of the metal 140. The planarization process may be, for example, a CMP process.

As described above, various embodiments provide methods of making semiconductor devices with wide source/drain contacts that minimize contact resistance. In some embodiments, the liner layer along sidewalls of the second portion of the source/drain contact is removed after depositing the conductive metal, which reduces resistance. The disclosed methods avoid electrical shorting between adjacent contacts. In one embodiment, the bilayer oxide is disposed around the second portion of the source/drain contact. In another embodiment, a low-resistance metal spacer is formed around the second portion of the source/drain contact.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a source/drain contact, the method comprising:
    forming a first trench in an inter-layer dielectric (ILD) arranged on a substrate, the first trench extending between a first gate and a second gate;
    filling the first trench with a metal to form a first portion of the source/drain contact;
    depositing a first oxide on the first portion of the source/drain contact, the first gate, and the second gate;
    forming a second trench in the first oxide to form a second portion of the source/drain contact;
    depositing a liner on an endwall of the second trench and on a sidewall of the second trench, the liner contacting the first portion of the source/drain contact;
    depositing a metal on the liner to fill the second trench;
    recessing the liner by a partial etch process such that a portion of the liner remains arranged on the endwall of the trench between the metal and the first portion, the partial etch process forming a recess between the first oxide and the metal;
    recessing the first oxide by a partial etch process such that a portion of the first oxide remains arranged on the first gate and the second gate; and
    depositing a second oxide on the first oxide to form a bilayer oxide over the first gate and the second gate.

2. The method of claim 1, further comprising depositing a metal layer on the metal filling the second trench after recessing the liner and the first oxide, and then etching to form a metal spacer along a sidewall of the metal filling the second trench.

3. The method of claim 2, wherein the metal spacer is arranged between the metal and the second oxide.

4. The method of claim 2, wherein the metal layer is cobalt or copper.

5. The method of claim 1, wherein the first oxide and the second oxide comprise a different material.

6. The method of claim 1, wherein recessing the first oxide and the liner expose the metal, and the second oxide contacts the metal.

7. The method of claim 1, wherein the second oxide is a low-k oxide with a k<4.0.

* * * * *